US011905398B2

(12) United States Patent
Wei et al.

(10) Patent No.: US 11,905,398 B2
(45) Date of Patent: Feb. 20, 2024

(54) FILM AND ELECTRONIC DEVICE COMPRISING SAME

(71) Applicant: HANGZHOU FIRST APPLIED MATERIAL CO., LTD., Zhejiang (CN)

(72) Inventors: Mengjuan Wei, Zhejiang (CN); Guodong Tang, Zhejiang (CN); Hongbing Hou, Zhejiang (CN); Guangda Zhou, Zhejiang (CN)

(73) Assignee: HANGZHOU FIRST APPLIED MATERIAL CO., LTD., Zhejiang (CN)

( * ) Notice: Subject to any disclaimer, the term of this patent is extended or adjusted under 35 U.S.C. 154(b) by 0 days.

(21) Appl. No.: 17/614,574

(22) PCT Filed: Aug. 17, 2020

(86) PCT No.: PCT/CN2020/109634
§ 371 (c)(1),
(2) Date: Nov. 29, 2021

(87) PCT Pub. No.: WO2021/253612
PCT Pub. Date: Dec. 23, 2021

(65) Prior Publication Data
US 2023/0103244 A1    Mar. 30, 2023

(30) Foreign Application Priority Data
Jun. 15, 2020 (CN) .......................... 202010540366.3

(51) Int. Cl.
| | |
|---|---|
| C09J 11/08 | (2006.01) |
| C09J 123/08 | (2006.01) |
| C09J 151/06 | (2006.01) |
| C09J 7/10 | (2018.01) |
| H01L 31/048 | (2014.01) |
| B32B 17/10 | (2006.01) |
| C08J 5/18 | (2006.01) |
| C08L 23/08 | (2006.01) |

(52) U.S. Cl.
CPC ....... C08L 23/0892 (2013.01); C08L 23/0815 (2013.01); C08L 23/0853 (2013.01); C08L 2203/16 (2013.01); C08L 2203/206 (2013.01); C08L 2205/025 (2013.01)

(58) Field of Classification Search
CPC .. C08L 23/0892; C08L 23/0815; C08L 51/00; C08L 51/003; C08L 51/106; C08L 2203/16; C08L 2203/206
See application file for complete search history.

(56) References Cited

U.S. PATENT DOCUMENTS

| | | | |
|---|---|---|---|
| 4,537,836 A | 8/1985 | Adur et al. | |
| 2002/0086940 A1* | 7/2002 | Ota ....................... | C08F 255/08 525/74 |
| 2017/0141251 A1 | 5/2017 | Van Duijnhoven et al. | |

FOREIGN PATENT DOCUMENTS

| | | |
|---|---|---|
| CN | 1344752 A | 4/2002 |
| CN | 101466809 B | 4/2013 |
| CN | 105176071 A | 12/2015 |
| CN | 105722893 A | 6/2016 |
| CN | 106024946 A | 10/2016 |
| CN | 107286854 A | 10/2017 |
| CN | 107406639 A | 11/2017 |
| CN | 110016170 A | 7/2019 |
| CN | 110713803 A | 1/2020 |
| CN | 111423824 A | 7/2020 |
| JP | S5098937 A | 8/1975 |
| JP | H06263971 A | 9/1994 |
| JP | H06263972 A | 9/1994 |
| JP | 2002167412 A | 6/2002 |
| JP | 2004510865 A | 4/2004 |
| JP | 2005163030 A | 6/2005 |
| JP | 2011165908 A | 8/2011 |
| JP | 2012512523 A | 5/2012 |
| JP | 2012238857 A | 12/2012 |
| JP | 2017088683 A | 5/2017 |
| WO | 2011151969 A | 7/2013 |

(Continued)

OTHER PUBLICATIONS

CN107406639 machine translation (Year: 2023).*
Corresponding CN search results.
Corresponding JP first search results dated Oct. 24, 2022.
Haddadi-Asl, V. et al., <Radiation Graft Modification of Ethylene-Pro Pylene Rubber-II. Effect of Additives>, «Radial. Phys. Chem.», 1995, vol. 45, pp. 191-198.
PCT Publication with ISR.

*Primary Examiner* — Irina S Zemel
*Assistant Examiner* — Jeffrey S Lenihan
(74) *Attorney, Agent, or Firm* — Gang Yu

(57) ABSTRACT

Provided are a film and an electric device comprising the same. The film comprises at least one modified polyolefin resin layer. A resin forming the modified polyolefin resin layer comprises 1-100% of modified polyolefin resin. A main chain in the modified polyolefin resin is an ethylene-α-olefin copolymer. A grafted branched chain in the modified polyolefin resin is selected from a compound formed by a vinyl monomer comprising one or more of anhydride group, hydroxyl, ester group, carbonyl, acylamino, pyridyl, epoxy, pyrrolidonyl and glycidyl. A molecular weight of the grafted branched chain is 150-8000 g/mol. The film prepared from the modified POE layer with the main chain and the grafted branched chain has excellent anti-PID performance. The layers have a better adhesive property without a laminated interface therebetween. The co-extruded film further has an excellent water vapor barrier property, a relatively high insulating property and a relatively high light transmittance.

19 Claims, No Drawings

(56) References Cited

FOREIGN PATENT DOCUMENTS

| WO | 2016084681 A | 5/2017 |
|----|--------------|--------|
| WO | 2017122713 A | 11/2018 |

* cited by examiner

FILM AND ELECTRONIC DEVICE COMPRISING SAME

TECHNICAL FIELD

The present disclosure relates to the field of photoelectric converting device devices, in particular to a film and an electric device comprising the same.

BACKGROUND

Photoelectric conversion refers to conversion of solar energy into electric energy via a photovoltaic effect. A common electronic device (a photoelectric converting device) capable of realizing the photoelectric converting process includes, but not limited to, a solar battery (for example, a crystalline silicon battery, an amorphous silicon cell, a cadmium telluride battery, a copper-indium-gallium-tin battery and a perovskite battery), a liquid crystal panel, an electroluminescent device, a plasma display device, a sensor and the like. It is usually sealed by one or more layers of polymer materials, and a sealing material is then adhered to a upper substrate and a lower substrate to form an intact electronic device module. For example, a crystalline silicon solar battery assembly is usually an intact solar battery assembly formed by laminating a front glass substrate, a front sealing layer polymer, the crystalline silicon battery, a back sealing layer polymer, a back glass substrate and a polymer substrate by heating and pressurizing the same by a vacuum laminator.

The polymer sealing material usually needs to meet the following conditions: I) bonding property. The polymer sealing material heated to melt is bonded to the electronic device and the substrate via a chemical action, and it is usually expected that in a long-term using process, the sealing material, the electronic device and the substrate are not layered. II) flexibility. The material has a relatively low elasticity modulus to prevent the electronic device from being damaged by an external impact; and III) transparency. For example, according to the solar battery, the sealing material needs to be high in light transmittance, such that the sunlight is utilized to the maximum extent, and thus, the electricity generating efficiency is improved. IV) insulativity. Usually, the polymer sealing material needs a relatively high volume resistivity, such that a large leakage current is prevented from being generated. V) chemical stability. The solar assembly endures high temperature, high moisture, ultraviolet radiation and the like during long-term outdoor use, and a condition that the sealing material is deteriorated severely to lead to yellowing, decline of mechanical property, release of corrosive compounds and the like is avoided. VI) heat resistance. The solar assembly ensures long-term high-temperature action outdoors, and the sealing material shall not flow or creep, such that it is usually needed to crosslink the sealing material.

At present, a common encapsulation material for the photoelectric converting device is ethylene-vinyl acetate and polyolefin, and ethylene-vinyl acetate will generate acetic acid in the using process of the photovoltaic assembly to lead to a problem of corrosion of the electronic device or PID (potential induced decay). Polyolefin is superior to ethylene-vinyl acetate copolymer in water vapor barrier property and air tightness. The cost of polyolefin is relatively high, and the two can be used together. The cost is lowered while performance is considered. When the two are used simultaneously, the bonding property of the film is reduced obviously. In an existing literature, small molecular amide compounds are directly added into a film polymerization process. But in a laminating process, it is easy to generate bubbles on the surface of the film to affect appearance of the assembly and reduce the crosslinking degree of the encapsulation material, such that the bonding force between the encapsulation material and the assembly is reduced, and therefore, the electricity generating power is further reduced, and a service life of 25 years of the photovoltaic assembly is hardly achieved.

Thus, it is necessary to provide a novel encapsulation material for an electronic device to improve the bonding property and the anti-PID property of the modified polyolefin film or a co-extruded film of the polyolefin film and the ethylene-vinyl acetate copolymer.

SUMMARY

It is thereof a main object of the present disclosure to provide a film and an electronic device comprising the same so as to solve the technical problem that it is poor in a bonding poor bonding property and anti-PID property between an existing polyolefin film and an ethylene-vinyl acetate copolymer layer.

In order to achieve the object, according to one aspect of the present disclosure, a film is provided. The film includes at least one modified polyolefin resin layer. A resin forming the modified polyolefin resin layer includes 1-100% of modified polyolefin resin. A main chain in the modified polyolefin resin is an ethylene-α-olefin copolymer. A grafted branched chain in the modified polyolefin resin is a compound formed by vinyl monomers with one or more of anhydride group, hydroxyl, ester group, carbonyl, acylamino, pyridyl, epoxy, pyrrolidonyl and glycidyl. A molecular weight of the grafted branched chain is 150-8000 g/mol.

Further, the grafted branched chain is a compound with acylamino while the compound has a molecular weight of 1000-5000 g/mol; and in the modified polyolefin resin, a grafting ratio of the grafted branched chain is 0.5-15%.

Further; the grafted branched chain is formed by the compounded formed by the vinyl monomers with acylamino shown in a formula (I) and the main chain via a free radical grafting reaction,

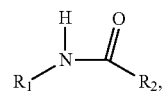

formula (I)

wherein $R_1$ is H, a group A, a substituent formed by substituting at least one hydrogen atom in the group A with hydroxyl or epoxy or a substituent formed by substituting at least one methylene in the group A with carboxyl, the group A is straight-chain alkyl, branched chain alkyl or cycloalkyl, and a carbon number of the group A is smaller than or equal to 10 and $R_2$ is alkenyl with a carbon number of 2-20.

Further, $R_2$ is selected from vinyl, propenyl, butadienyl, butenyl, pentenyl, pentadienyl, hexenyl, hexadienyl, heptenyl, octenyl, decenyl, undecenyl, dodecenyl, tetradecenyl, hexadecenyl or octadecenyl.

Further, the vinyl monomer with acylamino is selected from one or more of a group composed of acryloylamino, methacrylamino, N-methacrylamino, N-ethylacrylamino, N-isopropyl acrylamino, N-tert-butyl acrylamino, N-hydroxymethyl acrylamino, N-hydroxyethyl acrylamino, N-(2-hydroxyl propyl) acrylamino, N,N-methylene bisacrylamino, maleimido, oleamide, 9-hexadecanoenamino, N-(2-hydroxyl ethyl)-10-undecenamino, 9-tetradecenamino, 9-dodecaenamino, 9-decarbonamino, octenamino, heptanamino, hexenamino, pentenamino and butenamino.

Further, the ethylene-α-olefin copolymer is a copolymer of ethylene and at least one α-olefin with a carbon number smaller than or equal to 10.

Further, the α-olefin copolymer with the carbon number smaller than or equal to 10 is selected from one or more of a group composed of propylene, 1-butene, 1-hexene, 1-pentene, 1-octylene or 4-methyl-1-octylene.

Further, a density of the ethylene-α-olefin copolymer is 0.86-0.89 g/cm$^3$, and a melt index of the ethylene-α-olefin copolymer is 1-40 g/10 min.

Further, the density of the ethylene-α-olefin copolymer is 0.87-0.88 g/cm$^3$, and a melt index of the ethylene-α-olefin copolymer is 3-30 g/10 min.

Further, the film further includes at least one ethylene-vinyl acetate copolymer layer, wherein the film is the ethylene-vinyl acetate copolymer layer while the adjacent layers are different.

Further, a thickness ratio of the adjacent modified polyolefin resin layer to the ethylene-vinyl acetate copolymer layer is 1:(1 to 3).

Further, a raw material forming the modified polyolefin resin layer and the ethylene-vinyl acetate copolymer layer further comprises one or more of a crosslinking agent, an assistant crosslinking agent, an antioxidant, an ultraviolet light absorber, a light stabilizer, a tackifier, a corrosion inhibitor and a pigment.

The application in another aspect provides an electronic device, including the encapsulating film, wherein the encapsulating film includes the film.

By applying the technical scheme of the present disclosure, the present disclosure has excellent beneficial effects that (1) It is easy to graft modified groups in the grafted branched chain with the ethylene-α-olefin copolymer copolymer, and the above-mentioned several groups include heteroatoms, such that polar groups are introduced, in particular amide groups with strong polarity, which is favorable to form intermolecular hydrogen bonds, and therefore, the crosslinking degree and the crosslinking density of a modified POE layer in the encapsulation material are improved, the water vapor barrier property and the ion barrier property of the modified POE film layer are improved and the anti-PID property of the film are improved.

(2) In the co-extruded film formed by the film, EVA or other polar materials in a surface layer are low in surface resistance and higher in ability to collect charges on the back surface of a battery piece, and the collected charges can be absorbed by the modified POE layer, such that the anti-PID property of the co-extruded film is further improved.

(3) The modified groups in the grafted branched chain can improve the polarity of the modified POE layer and is better in compatibility with the ethylene-vinyl acetate copolymer, and the polar groups in the laminating process have better heat stability, such that the bonding property between the modified POE layer and the EVA layer can be improved by introducing the polar groups, and a laminating interface is prevented during laminating.

DETAILED DESCRIPTION OF THE EMBODIMENTS

It should be noted that in the absence of conflict, the embodiments of the present disclosure and features in the embodiments can be combined with one another. Detail description on the present disclosure will be made below in combination with the embodiments.

As is described in the background art, the bonding property between the existing polyolefin film and the ethylene-vinyl acetate copolymer layer (EVA layer) is poor and meanwhile, there is a PID problem. To solve the problem, a film is provided. The film includes at least one modified polyolefin resin layer (modified POE layer). A resin forming the modified polyolefin resin layer comprises 1-100% of modified polyolefin resin. A main chain in the modified polyolefin resin is an ethylene-α-olefin copolymer. A grafted branched chain is a compound formed by vinyl monomers comprising one or more of anhydride group, hydroxyl, ester group, carbonyl, acylamino, pyridyl, epoxy, pyrrolidonyl and glycidyl. A molecular weight of the grafted branched chain is 150-8000 g/mol.

It is easy for the above-mentioned several groups to grafted onto the ethylene-α-olefin copolymer copolymer, and the above-mentioned several groups include heteroatoms, such that polar groups are introduced, which is favorable to form intermolecular hydrogen bonds, and therefore, the crosslinking degree and the crosslinking density of a modified POE layer in the encapsulation material are improved. The crosslinking reaction can destroy regularity of a chain segment of polyolefin layer, inhibit crystallization of the chain segment and reduce the dimension of crystal nucleus, such that a grain size of a crystal nucleus is smaller than a visible wavelength, and therefore, the light transmittance of the film can be improved. Meanwhile, the above-mentioned several groups can improve the polarity of the modified POE layer. As the polar groups have better heat stability in the laminating process and are better in compatibility with the ethylene-vinyl acetate copolymer, the bonding properties of the modified POE layer, the EVA layer and the like can be improved by introducing the polar groups. In the co-extruded film formed thereby, EVA or other polar materials in a surface layer are low in surface resistance and higher in ability to collect charges on the back surface of a battery piece, and the collected charges can be absorbed by the modified POE layer, such that the co-extruded film has an excellent anti-PID property.

In order to further improve the polarity of the POE layer, and further improve the bonding property between the POE layer and the EVA layer, preferably, the grafted branched chain is an acylamino-containing compound with a molecular weight, of 1000-5000 g/mol.

In a preferred embodiment, in the modified polyolefin resin, a grafting ratio of the grafted branched chain is 0.5-15%. The grafting ratio of the polar groups with the large molecular weights includes, but not limited to, the scope and is limited to the scope, which is favorable to further improve the compatibility between the polar groups with the large molecular weights and the ethylene-vinyl acetate copolymer, such that the bonding property between the modified POE layer and the EVA layer is further improved.

The acylamino-containing compound with the molecular weight of 1000-5000 g/mol has a better heat stability in the laminating process. Thus, bubbles are not formed in the laminating process. Therefore, when the compound is used as the grafted branched chain to form the modified POE layer, appearance can be prevented from being affected, and the bonding force between the encapsulation material and the assembly is not affected as a result of bubbles. Meanwhile, the acylamino modified POE has a better absorbing ability to an assistant. Therefore, compared with a POE material modified by other polar groups, the acylamino modified POE has better comprehensive performance. In a preferred embodiment, acylamino is formed by an organic matter as shown in a formula (I) taking out a hydrogen atom connected with a carbon atom,

formula (I)

wherein $R_1$ is a group A, a substituent formed by substituting at least one hydrogen atom in the group A with hydroxyl or epoxy or a substituent formed by substituting at least one methylene in the group A with carboxyl, the group A is straight-chain alkyl, branched chain alkyl or cycloalkyl, and a carbon number of the group A is smaller than or equal to 10 and $R_2$ is alkenyl with a carbon number of 2-20.

The acylamino formed by an organic matter as shown in a formula (I) taking out a hydrogen atom connected with a carbon atom has alkenyl with a polymerizable carbon number of 2-20, and in the laminating process, the modified POE layer is subjected to cross-linking polymerization, so that the crosslinking degree of the modified POE layer can be improved, the modified POE layer can be bonded with the EVA layer more compactly, and the bonding degree is further higher. In order to further improve the crosslinking density of the modified POE, more preferably, R2 includes, but not limited to, vinyl, propenyl, butadienyl, butenyl, pentenyl, pentadienyl, hexenyl, hexadienyl, heptenyl, octenyl, decenyl, undecenyl, dodecenyl, tetradecenyl, hexadecenyl or octadecenyl.

In a preferred embodiment, the vinyl monomer with acylamino is acryloylamino, methacrylamino, N-methacrylamino, N-ethylacrylamino, N-isopropyl acrylamino, N-tert-butyl acrylamino, N-hydroxymethyl acrylamino, N-hydroxyethyl acrylamino, N-(2-hydroxyl propyl) acrylamino, N,N-methylene bisacrylamino, maleimido, oleamide, 9-hexadecanoenamino, N-(2-hydroxyl ethyl)-10-undecenamino, 9-tetradecenamino, 9-dodecaenamino, 9-decarbonamino, octenamino, heptanamino, hexenamino, pentenamino and butenamino.

Compared with other polymers, ethylene-α-olefin copolymer has a more excellent water vapor barrier property, a relatively high insulating property and relatively high light transmittance, such that it is favorable to further improve the water vapor barrier property, the insulativity and the light transmittance by selecting the ethylene-α-olefin copolymer as a thermoplastic polymer resin. In a preferred embodiment, α-olefin forming the ethylene-α-olefin copolymer is a copolymer of ethylene and at least one α-olefin with a carbon number smaller than 10. More preferably, the α-olefin forming the ethylene-α-olefin copolymer is selected from one or more of a group composed of propylene, 1-butene, 1-hexene, 1-pentene, 1-octylene or 4-methyl-1-octylene. Further preferably, the α-olefin is 1-butene and/or 1-octylene.

In a preferred embodiment, a density of the ethylene-α-olefin copolymer is 0.86-0.89 g/cm³, preferably 0.87-0.88 g/cm³. If the density of the copolymer is too high, the light transmittance of the film may be affected and if the density of the copolymer is too low, the thermoplastic polymer resin may be tacky, which affects the processability. In a preferred embodiment, melt indexes of the ethylene-α-olefin copolymer and an ethylene homopolymer are 1-40 g/10 min, preferably, 3-30 g/10 min and more preferably 5-25 g/10 min. If the melt index of the thermoplastic polymer resin is too low, it is hard to form the film and the wettability of a substrate such as glass will be reduced, such that the bonding force is reduced. If the melt index is too high, it is easy to bond the encapsulated film to a film or an embossing roller in a production process. In addition, in the laminating process of the electronic device, the polymer has a phenomenon of overflowing glue at an edge as a result of high flowability after the polymer is melted. The melt indexes of the ethylene-α-olefin copolymer and the ethylene homopolymer are limited in the scope, which is favorable to improve the forming property of the film, the bonding force of the substrate and attractiveness of a film product.

In order to further improve the comprehensive performance of the film, a thickness ratio of the adjacent modified POE layer to the EVA layer is 1:(1 to 3).

In order to further improve the comprehensive performance of the film, in a preferred embodiment, a raw material forming the modified polyolefin resin layer and the ethylene-vinyl acetate copolymer layer further includes one or more of a crosslinking agent, an assistant crosslinking agent, an antioxidant, an ultraviolet light absorber, a light stabilizer, a tackifier, a corrosion inhibitor and a pigment. Further, compared with 100 parts by weight of modified polyolefin resin material or 100 parts by weight of the photovoltaic encapsulation material EVA resin, the raw material forming the modified polyolefin resin layer and the vinyl-vinyl acetate copolymer layer further includes 0.01-3 parts by weight of a crosslinking agent, 0.01-10 parts by weight of an assistant crosslinking agent, 0-0.4 part by weight of an ultraviolet absorber, 0-0.5 part by weight of an antioxidant, 0-1.0 parts by weight of a light stabilizer and 0-3.0 parts by weight of a tackifier.

The crosslinking agent is molecules with a plurality of olefinic unsaturated groups, which can promote crosslinking of the polymer, thereby achieving a higher crosslinking degree. The crosslinking agent in the composition can be selected from common types in the field. Preferably, the crosslinking agent includes, but not limited to, one or more of a group composed by tertiary butyl isopropyl peroxycarbonate, 2,5-dimethyl-2,5-(bistertiary butyl peroxy) hexane, tertiary butyl peroxycarbonate-2-ethylhexyl acrylate, 1,1-bis (tertiary butyl peroxy)-3,3,5-trimethyl cyclohexane, 1,1-bis (tertiary pentyl peroxy)-3,3,5-trimethyl cyclohexane, 1,1-bis (tertiary pentyl peroxyl) cyclohexane, 1,1-bis(tertiary butyl peroxy) cyclohexane, 2,2-bis(tertiary butyl peroxy) butane, tert-Amylperoxy 2-ethylhexyl carbonate, 2,5-dimethyl-2,5-di-(benzoylperoxy) hexane and:tert-Butyl peroxy-3,3,5-trimethylhexanoate.

In a preferred embodiment, the assistant crosslinking agent includes, but not limited to, triallyl isocyanurate, triallyl cyanurate, trimethylolpropane triacrylate, trimethylolpropane trimethacrylate, pentaerythritol triacrylate, tri(2-hydroxyethyl) isocyanurate triacrylate, ethoxylated trimethylolpropane triacrylate, propylated trimethylolpropane triacrylate, ethoxylated glycerol triacrylate, propylated glycerol triacrylate, pentaerythritol tetraacrylate, ethoxylated pentaerythritol tetraacrylate, trimethylolpropane tetraacrylate, ditrimethylolpropane tetraacrylate, ditrimethylolpropane tetramethylacrylate, propylated pentaerythritol tetraacrylate, 2,4,6-tri(2-propylenyl oxy)-1,3,5-triazine, tricycloquane dimethanol diacrylate, propylene oxide neopentyl glycol diacrylate, ethylated bisphenol A diacrylate, ethylated bisphenol A dimethacrylate, 2-butyl-2-ethyl-1,3- propanediol diacrylate, diethylene glycol dimethacrylate, diethylene glycol dimethacrylate and polyethylene glycol dimethacrylate.

The antioxidant is configured to improve a stability of a polymer in a extrusion processing step and in the long-time using process, and delay a degradation due to thermal oxidation. In a preferred embodiment, the antioxidant is a hindered phenol compound and/or a phosphite ester compound. Compared with other antioxidants, the antioxidant has the advantages of better stability and oxidation resistance. More preferably, the hindered phenol compound includes, but not limited to, one or more of a group composed of 2,6-di-tertiary butyl-4-ethyl phenol, 2,2'-methylene-bis-(4-methyl-6-tertiary butyl phenol), 2,2'-methylene-bis-(4-ethyl-6-tertiary butyl phenol), 4,4'-butylidene-bis-(3-methyl-6-tertiary butyl phenol), octadecyl-3-(3,5-di-tertiary-butyl-4-hydroxylphenyl) propionate, pentaerythritol-tetra[3-(3,5-di-tertiary butyl-4-hydroxyl phenyl) propionate], 7-octadecyl-3-(4'-hydroxyl-3'-5'-di-tertiary butyl phenyl) propionate, tetra-[methylene-3-(3'-5'-di-tertiary butyl-4'-hydroxy phenyl) propionate] methane; the phosphite ester compound includes, but not limited to, one or more of a group composed of tri(2,4-di-tertiary butyl phenyl) phosphite ester, bis[2,4-bis(1,1-dimethyl ethyl)-6-methyl phenyl] ethyl ester phosphorous acid, tetra(2,4-di-tertiary butyl phenyl)[1,1-biphenyl]-4,4'-diyl diphosphite and bis(2,4-i-tertiary butyl phenyl)pentaerythritol diphosphite ester.

The ultraviolet absorber refers to a substance capable of absorbing a lot of ultraviolet energy and converting the energy into heat, such that some electronic devices are prevented from being damaged by the ultraviolet rays. In a preferred embodiment, the ultraviolet absorber includes, but not limited to, a diphenyl ketone and/or benzotriazole substance, and more preferably, the ultraviolet absorber includes, but not limited to, one or more of a group composed of 2-hydroxyl-4-n-octyloxy diphenyl ketone, 2,2-tetramethylene bis(3,1-benzoxazine-4-one), 2-(2'-hydroxyl-5-methyl phenyl) benzotriazole and 2,2'-dihydroxyl-4,4'-dimethoxyl diphenyl ketone.

The light stabilizer is configured to improve the stability of the encapsulated film under long-time ultraviolet radiation. Preferably, the light stabilizer is a hindered amine compound. In a preferred embodiment, the light stabilizer includes, but not limited to, one or more of a group composed of bis(2,2,6,6-tetramethyl-4-piperidyl)sebate, bis(1-octyloxy-2,2,6,6-tetramethyl-4-piperidyl)sebate, a grafted copolymer by polymerizing 4-(methyl)acryloxy-2,2,6,6-tetramethyl-4-piperidyl with a α-allyl monomer, 4-hydroxyl-2,2,6,6-tetramethyl-1-pipradrol, 3,5-bis(1,1-dimethylethyl)-4-hydroxy-, hexadecylester, sebate bis-2,2,6,6-tetramethyl pipradrol and tri(1,2,2,6,6-pentamethyl-4-piperidyl) phosphite ester.

The bonding performance of the film can be improved by adding the tackifier. In a preferred embodiment, the tackifier includes, but not limited to, one or more of a group composed of γ-aminopropyltriethoxysilane, γ-methylacryloxypropyl trimethoxysilane, γ-(2,3-epoxy propoxy) propyl trimethoxy silane, vinyl trimethoxy silane, N-(β-aminoethyl)-γ-aminopropyltrimethoxysilane, γ-glycidyl oxypropyl trimethylsilane and 3-aminopropyl trimethylsilane.

In a preferred embodiment, the film further includes at least one ethylene-vinyl acetate copolymer layer (EVA layer), and the film is the ethylene-vinyl acetate copolymer layer when the adjacent layers are different.

Ethylene-α-olefin copolymer has an excellent water vapor barrier property, a relatively high insulating property and a relatively high light transmittance and is low in cost. Therefore, when the film is formed by the modified POE layer modified by the main chain and the grafted branched chain and the EVA layer, the layers have a better bonding property without laminating interfaces. The film further has the advantages of excellent water vapor barrier property, good insulativity, high light transmittance, low cost and the like.

The corrosion resistance of the film can be improved by adding the corrosion resistant. In a preferred embodiment, the corrosion resistant can absorb substances of free acids in the film, including, but not limited to, a metal oxide, a metal hydroxide and a metal carbonic compound. The corrosion resistant includes, but not limited to, one or more of a group composed of magnesium hydroxide, calcium hydroxide, zinc hydroxide, barium hydroxide, aluminum hydroxide, magnesium oxide, calcium oxide, zinc oxide, barium oxide, aluminum oxide, magnesium carbonate, calcium carbonate, zinc carbonate, barium carbonate, hydrotalcite and the like.

By adding the pigment, different application scenarios can be met according to customer demands. In a preferred embodiment, the pigment includes, but not limited to, one or more of following substances mixed in any proportion: one or more of a group composed of calcium carbonate, barium sulfate, talcum powder, titanium dioxide, zinc oxide, carbon black, graphene, graphene oxide, copper chromite black, magnesium hydroxide, aluminum hydroxide, aluminum oxide, magnesium oxide, boron nitride, silicon carbide, ammonium phosphate, ammonium polyphosphate, pentaerythritol, dipentaerythritol, polypentaerythritol and melamine polyphosphate borate.

The present disclosure on the other hand further provides a method for preparing a preferred film, including: materials of the modified POE layer and the EVA layer are added into different extrudes after being mixed uniformly; and the extruded material of the modified POE layer and the extruded material of the EVA layer are injected into a same die head after being smelted and plastified respectively, the materials are combined in the T type die head to form a melt flow, and the multilayered film is prepared by steps of melt extrusion, cast film forming, cooling, slitting, rolling and the like.

The application in another aspect further provides an electronic device, including the encapsulated film, wherein the encapsulated film includes the film provided by the application.

In the film prepared by the method provided by the present disclosure, the layers have a better adhesive property without a laminated interface therebetween. Further, the film further has an excellent water vapor barrier property, a relatively high insulating property, anti-PID performance and a relatively high light transmittance. Thus, the film is taken as the encapsulated film, which is favorable to improve the electricity generating power of the electronic device and prolong the service life thereof.

Further detailed description is made on the application below in combination with specific embodiments, and these embodiments are not construed to limit the protection scope claimed by the application.

EXAMPLE 1

A modified polyolefin layer: based on parts by weight, 99 parts of ethylene-hexene copolymer is taken and 1 part of ethylene-hexene copolymer grafted polyacrylamide (the molecular weight of the grafted branched chain is 150 g/mol, the grafting ratio is 10 wt %, the density is 0.875 g/cm$^2$ and the melt index is 25 g/10 min), 0.5 part of crosslinking agent tertiary butyl peroxy isopropyl carbonate and 0.5 part of assistant crosslinking agent trimethylolpropane trimethacrylate are added.

An ethylene vinyl acetate copolymer layer: based on parts by weight, 100 parts of ethylene-vinyl acetate (VA content is 28%, Dupont, US) is taken, and 0.5 part of crosslinking agent tertiary butyl peroxy 2-ethyl hexyl carbonate and 0.5 part of assistant crosslinking agent trimethylolpropane triacrylate are added.

A composition of resins and additives in the modified polyolefin layer and the ethylene-vinyl acetate copolymer layer is added into different extruders after being uniformly mixed. The extruded material of the modified polyolefin layer and the extruded material of the ethylene vinyl acetate copolymer layer are injected into a same die head after being smelted and plastified respectively. The materials are combined in the T type die head to form a melt flow, and a double layered photovoltaic encapsulated film EVA-POE, marked as E1, is prepared by steps of melt extrusion, cast film forming, cooling, slitting, rolling and the like, wherein a thickness of the modified polyolefin layer of the encapsulated film is 0.2 mm and a thickness of the ethylene-vinyl acetate copolymer layer thereof is 0.3 mm calculated by a distributor.

EXAMPLE 2

A modified polyolefin layer: based on parts by weight, 90 parts of ethylene-octylene copolymer is taken and 10 part of ethylene-octylene copolymer grafted poly-9-hexadecano-acylamino (the molecular weight of the grafted branched chain is 5000 g/mol, the grafting ratio is 0.5 wt %, the density is 0.862 g/cm$^2$ and the melt index is 15 g/10 min), 1.5 parts of crosslinking agent 1,1-bis(tertiary butyl peroxy)-3,3,5-trimethyl cyclohexane and 3 part of assistant crosslinking agent ethoxylated trimethylolpropane triacrylate are added.

An ethylene vinyl acetate copolymer layer: based on parts by weight, 100 parts of ethylene-vinyl acetate (VA content is 24%, Dupont, US) is taken, and 1 part of crosslinking agent tertiary butyl peroxy 2-ethyl hexyl carbonate and 2 parts of assistant crosslinking agent tri(2-ethoxy) isocyanurate triacrylate are added.

A composition of resins and additives in the modified polyolefin layer and the ethylene-vinyl acetate copolymer layer is added into different extruders after being uniformly mixed. The extruded material of the modified polyolefin layer and the extruded material of the ethylene vinyl acetate copolymer layer are injected into a same die head after being smelted and plastified respectively, the materials are combined in the T type die head to form a melt flow, and a three layered photovoltaic encapsulated film EVA-POE-EVA with an outer layer of EVA and a middle layer of POE, marked as E2, is prepared by steps of melt extrusion, cast film forming, cooling, slitting, rolling and the like, wherein a thickness of the modified polyolefin layer of the encapsulated film is 0.2 mm and a thickness of the ethylene-vinyl acetate copolymer layer thereof is 0.15 mm calculated by a distributor.

EXAMPLE 3

A modified polyolefin layer: based on parts by weight, 100 parts of ethylene-butene copolymer grafted poly-N-hydroxymethyl acrylamide (the molecular weight of the grafted branched chain is 1000 g/mol, the grafting ratio is 5 wt %, the density is 0.870 g/cm$^3$ and the melt index is 20 g/10 min), 2 parts of crosslinking agent 1,1-bis(tertiary pentyl peroxy) cyclohexane, 0.02 part of assistant cross linking agent trimethylolpropane triacrylate, 1.0 part of assistant crosslinking agent ethoxylated glycerol triacrylate, 0.8 part of tackifier vinyl triperoxy tertiary butyl silane and 0.8 part of light stabilizer bis-2,2,6,6-tetramethyl pipradrol sebacate are added.

An ethylene vinyl acetate copolymer layer: based on parts by weight, 100 parts of ethylene-vinyl acetate (VA content is 28%, Dupont, US) is taken, and 2 parts of crosslinking agent tertiary butyl peroxy 2-ethyl hexyl carbonate, 1 part of assistant crosslinking agent diethylene glycol dimethacrylate and 0.8 part of light stabilizer tri(1,2,2,6,6-pentamethyl-4-piperidyl) phosphite ester are added.

A composition of resins and additives in the modified polyolefin layer and the ethylene-vinyl acetate copolymer layer is added into different extruders after being uniformly mixed. The extruded material of the modified polyolefin layer and the extruded material of the ethylene vinyl acetate copolymer layer are injected into a same die head after being smelted and plastified respectively, the materials are combined in the T die head to form a melt flow, and a double layered photovoltaic encapsulated film EVA-POE, marked as E3, is prepared by steps of melt extrusion, cast film forming, cooling, slitting, rolling and the like, wherein a thickness of the modified polyolefin layer of the encapsulated film is 0.2 mm and a thickness of the ethylene-vinyl acetate copolymer layer thereof is 0.25 mm calculated by a distributor.

EXAMPLE 4

Different from the example 3, the modified polyolefin layer is ethylene-butene copolymer grafted N,N'-methylene bisacrylamide (the molecular weight of the grafted branched chain is 2000 g/mol, the grafting ratio is 1.5 wt %, the density is 0.880 g/cm$^3$ and the melt index is 18 g/10 min).

EXAMPLE 5

Different from the example 3, the modified polyolefin layer is ethylene-butene copolymer grafted N-(2-hydroxyl ethyl)-undecano-10-acylamino (the molecular weight of the grafted branched chain is 8000 g/mol, the grafting ratio is 1.0 wt %, the density is 0.873 g/cm$^3$ and the melt index is 3 g/10 min).

EXAMPLE 6

Different from the example 3, the modified polyolefin layer is ethylene-butene copolymer grafted N-ethyl acryloylamino (the molecular weight of the grafted branched chain is 500 g/mol, the grafting ratio is 15 wt %, the density is 0.862 g/cm$^3$ and the melt index is 15 g/10 min).

EXAMPLE 7

Different from the example 3, the modified polyolefin layer is ethylene-butene copolymer grafted polyhydrolyzed polymaleic anhydride (the molecular weight of the grafted branched chain is 2300 g/mol, the grafting ratio is 1.5 wt %, the density is 0.875 g/cm$^3$ and the melt index is 20 g/10 min).

EXAMPLE 8

Different from the example 3, the modified polyolefin layer is ethylene-butene copolymer grafted polyhydrolyzed poly(4-vinyl pyridine) (the molecular weight of the grafted branched chain is 300 g/mol, the grafting ratio is 10 wt %, the density is 0.865 g/cm$^3$ and the melt index is 25 g/10 min).

EXAMPLE 9

Different from the example 3, the modified polyolefin layer is ethylene-butene copolymer grafted polyhydrolyzed poly(N-vinyl-2-pyrrolidone) (the molecular weight of the grafted branched chain is 330 g/mol, the grafting ratio is 5 wt %, the density is 0.870 g/cm$^3$ and the melt index is 24 g/10 min).

EXAMPLE 10

Different from the example 3, the modified polyolefin layer is ethylene-butene copolymer grafted polyhydrolyzed polyglycidyl glyceryl cage polysilsesquioxane (the molecular weight of the grafted branched chain is 1300 g/mol, the grafting ratio is 2.5 wt %, the density is 0.873 g/cm$^3$ and the melt index is 19 g/10 min).

EXAMPLE 11

Different from the example 3, the modified polyolefin layer is ethylene-butene copolymer grafted poly-N-hydroxymethyl acrylamide (the molecular weight of the grafted branched chain is 1000 g/mol, the grafting ratio is 0.1 wt %, the density is 0.869 g/cm$^3$ and the melt index is 19 g/10 min).

EXAMPLE 12

Different from the example 3, the modified polyolefin layer is ethylene-butene copolymer grafted N-hydroxymethyl acrylamide (the molecular weight of the grafted branched chain is 1000 g/mol, the grafting ratio is 18 wt %, the density is 0.870 g/cm$^3$ and the melt index is 21 g/10 min).

EXAMPLE 13

Different from the example 3, the grafted branched chain is ethylene-butene copolymer containing epoxy group and acylamino simultaneously (the molecular weight of the grafted branched chain is 1000 g/mol, the grafting ratio is 15 wt %, the density is 0.875 g/cm$^3$ and the melt index is 21 g/10 min).

EXAMPLE 14

Different from the example 3, the grafted branched chain is ethylene-hexene copolymer grafted polyacrylamide (the molecular weight of the grafted branched chain is 1000 g/mol, the grafting ratio is 5 wt %, the density is 0.875 g/cm$^3$ and the melt index is 15 g/10 min).

EXAMPLE 15

Different from the example 3, the molecular weight of the grafted branched chain is 200 g/mol, the grafting ratio is 15 wt %, the density is 0.875 g/cm$^3$ and the melt index is 15 g/10 min).

EXAMPLE 16

Different from the example 3, the molecular weight of the grafted branched chain is 5000 g/mol, the grafting ratio is 0.5 wt %, the density is 0.875 g/cm$^3$ and the melt index is 10 g/10 min).

EXAMPLE 17

Different from the example 3, the modified polyolefin layer: a single layered film: based on parts by weight, 100 parts of ethylene-butene copolymer grafted poly-N-hydroxymethyl acrylamide (the molecular weight of the grafted branched chain is 1000 g/mol, the grafting ratio is 5 wt %, the density is 0.870 g/cm$^3$ and the melt index is 20 g/10 min), 2 parts of crosslinking agent 1,1-bis(tertiary pentyl peroxy) cyclohexane, 0.02 part of assistant crosslinking agent trimethylolpropane triacrylate, 1.0 part of assistant crosslinking agent ethoxylated glycerol triacrylate, 0.8 part of tackifier vinyl triperoxy tertiary butyl silane and 0.8 part of light stabilizer bis-2,2,6,6-tetramethyl pipradrol sebacate are added. The components are mixed uniformly, and the mixture is subjected to the steps of pre-mixing, melt extrusion, cast film forming, cooling, slitting, rolling and the like to prepare a single layered modified polyolefin layer film encapsulation material.

EXAMPLE 18

Different from the example 17, the modified polyolefin layer is ethylene-butene copolymer grafted N,N'-methylene bisacrylamide (the molecular weight of the grafted branched chain is 2000 g/mol, the grafting ratio is 1.5 wt %, the density is 0.880 g/cm$^3$ and the melt index is 18 g/10 min).

EXAMPLE 19

Different from the example 17, the modified polyolefin layer is ethylene-butene copolymer grafted N-(2-hydroxyl ethyl)-undecano-10-acylamino (the molecular weight of the grafted branched chain is 8000 g/mol, the grafting ratio is 1.0 wt %, the density is 0.873 g/cm$^3$ and the melt index is 3 g/10 min).

EXAMPLE 20

Different from the example 17, the modified polyolefin layer is ethylene-butene copolymer grafted polyhydrolyzed polymaleic anhydride (the molecular weight of the grafted branched chain is 2300 g/mol, the grafting ratio is 1.5 wt %, the density is 0.875 g/cm$^3$ and the melt index is 20 g/10 min).

COMPARATIVE EXAMPLE 1

A polyolefin film: based on parts by weight, 100 g parts of ethylene-hexene copolymer (the density is 0.870 g/cm$^3$ and the melt index is 25 g/10 min) is taken, and 3 parts of acrylamide, 0.5 part of crosslinking agent tertiary butyl peroxy isopropyl carbonate and 0.5 part of assistant crosslinking agent trimethylolpropane trimethacrylate are added.

COMPARATIVE EXAMPLE 2

Different from the example 1, the modified polyolefin layer is ethylene-hexene copolymer grafted acrylamide (the molecular weight of the branched chain is 71 g/mol and the grafting ratio is 10 wt %).

COMPARATIVE EXAMPLE 3

Different from the example 1, the modified polyolefin layer is ethylene-hexene copolymer grafted acrylamide (the molecular weight of the branched chain is 10000 g/mol and the grafting ratio is 10 wt %).

Performance Test:

Bonding forces and degrees of crosslinking are tested on the examples 1-20 and the comparative examples 1-3 and comparison on laminating characteristics of assemblies is made.

Test Item and Test Method

1. Bonding Force 300 mm*1500 mm glass/films (two layers)/flexible backboard are stacked successively and are put in the vacuum laminator, and are laminated according to a laminating process for 18 minutes at 150° C. to manufacture a laminate.

In a width direction, the flexible backboard/film is cut into 10 mm±0.5 mm test samples every 5 mm to test the bonding force between the film and the glass. According to a test method of GB/T 2790-1995, a stripping force between the film and the glass is tested on a tension tester at a tension speed of 100 mm/min±10 mm/min, and an arithmetic mean value of three tests is taken correct to 0.1 N/cm.

2. Crosslinking Degree

It is tested by a method of heating and extracting xylene. A ratio of mass not dissolved by xylene to an initial mass is the crosslinking degree. The arithmetic mean value of the three samples is represented by a percentage.

3. Evaluation on Appearance of Laminated Assembly

The glass/film/battery piece/film/glass are stacked in sequence and are manufactured by the laminating process for testing the bonding force to manufacture a standard double glass solar battery assembly. A specification of the assembly is a plate of 60 (6*10) battery pieces. According to different films, appearance is evaluated once every 100 assemblies are manufactured. An evaluation standard judges air bubbles, impurities and delamination between the film, the battery pieces or the glass, specifically:

○: none Δ: slight ×: severe

4. PID Aging Test of the Assembly

A double-sided battery is selected and is tested according to IECTS 2804-1: 2015. A test condition is strict to 85° C., 85% RH in addition with a negative 1500 V constant direct current voltage, and power attenuation of the photovoltaic assembly before and after PID test in 192 hours.

A test result of all performance parameters is as shown in the table 1.

TABLE 1

Performance test results

| | Bonding force (N/cm) with glass | Crosslinking degree (%) | Air bubbles of the assembly | Impurities of the assembly | Delamination of the assembly | PID192 power attenuation (%) Front side | Back side |
|---|---|---|---|---|---|---|---|
| Example 1 | 137 | 83.4 | ○ | ○ | ○ | 1.81 | 3.10 |
| Example 2 | 146 | 86.2 | ○ | ○ | ○ | 1.12 | 2.85 |
| Example 3 | 154 | 86.9 | ○ | ○ | ○ | 0.25 | 1.08 |
| Example 4 | 142 | 85.7 | ○ | ○ | ○ | 1.34 | 2.98 |
| Example 5 | 132 | 82.8 | ○ | ○ | ○ | 1.92 | 3.15 |
| Example 6 | 146 | 84.6 | ○ | ○ | ○ | 1.05 | 2.92 |
| Example 7 | 142 | 85.7 | ○ | ○ | ○ | 1.38 | 2.97 |
| Example 8 | 140 | 84.3 | ○ | ○ | ○ | 1.30 | 3.01 |
| Example 9 | 143 | 84.5 | ○ | ○ | ○ | 1.25 | 2.58 |
| Example 10 | 149 | 86.5 | ○ | ○ | ○ | 0.53 | 1.39 |
| Example 11 | 147 | 86.2 | ○ | ○ | ○ | 0.68 | 1.57 |
| Example 12 | 149 | 86.4 | ○ | ○ | ○ | 0.49 | 1.28 |
| Example 13 | 145 | 86.1 | ○ | ○ | ○ | 1.16 | 2.86 |
| Example 14 | 150 | 86.6 | ○ | ○ | ○ | 0.38 | 0.99 |
| Example 15 | 138 | 83.6 | ○ | ○ | ○ | 1.92 | 3.23 |
| Example 16 | 148 | 86.4 | ○ | ○ | ○ | 0.75 | 1.83 |
| Example 17 | 219 | 87.1 | ○ | ○ | ○ | 2.48 | 4.67 |
| Example 18 | 225 | 88.2 | ○ | ○ | ○ | 2.29 | 4.02 |
| Example 19 | 218 | 87.5 | ○ | ○ | ○ | 2.52 | 4.81 |
| Example 20 | 227 | 88.5 | ○ | ○ | ○ | 2.21 | 3.95 |
| Comparative example 1 | 208 | 86.8 | × | × | ○ | 5.58 | 9.54 |
| Comparative example 2 | 68 | 72.4 | Δ | × | ○ | 3.21 | 7.04 |
| Comparative example 3 | 61 | 68.9 | ○ | ○ | × | 4.89 | 9.07 |

It can be seen from the above description that the above-mentioned examples achieve the following technical effects:

It can be known by comparing the examples 1-20 with the comparative examples 1-3 that the co-extruded film provided by the application is higher in crosslinking degree, better in bonding property and higher in anti-PID performance.

It can be known by comparing the examples 3-20 that the types of the grafted groups in the modified polyolefin resin layer, the grafting ratio and the molecular weight of the branched chain are defined in the preferred scope of the application, which is favorable to improve the crosslinking degree, the bonding property and the anti-PID performance of the co-extruded film.

It should be noted that terms "first", "second" and the like in the description and claims of the application are used for distinguishing similar objects and not have to describe a specific sequence or precedence order. It should be understood that terms used in this way can be interchanged, such that the embodiments of the application described herein can be, for example, implemented in sequences except those described herein.

The above is merely preferred embodiments of the present disclosure and is not used to limit the present disclosure. For those skilled in the art, various alternations and changes can be made on the present disclosure. Any modification, equivalent replacement, improvement, etc. made within the spirit and principle of the present disclosure shall be regarded as within the protection scope of the present disclosure.

What is claimed is:

1. A film, the film comprising
at least one modified polyolefin resin layer: a resin forming the modified polyolefin resin layer comprises 1-100% of modified polyolefin resin, a main chain in the modified polyolefin resin is an ethylene-α-olefin copolymer, a grafted branched chin in the modified polyolefin resin is selected from a compound firmed by vinyl monomers with acylamino, or a compound formed by acylamino and one or more of anhydride group, hydroxyl, ester group, carbonyl, pyridyl, epoxy, pyrrolidonyl and glycidyl, and the grafted branched chain has a molecular weight of 1000-5000 g/mol; and in the modified polyolefin resin, a grafting ratio of the grafted branched chain is 0.5-15%.

2. The film according to claim 1, wherein the grafted branched chain is formed by the compound formed by the vinyl monomers with acylamino shown in a formula (I) and the main chain via a free radical grafting reaction,

formula (I)

wherein $R_1$ is H, a group A, a substituent formed by substituting at least one hydrogen atom in the group A with hydroxyl or epoxy or a substituent formed by substituting at least one methylene in the group A with carboxyl, the group A is straight-chain alkyl, branched chain alkyl or cycloalkyl, and a carbon number of the group A is smaller than or equal to 10 and Ra is alkenyl with a carbon number of 2-20.

3. The film according to claim 2, wherein $R_2$ is selected from vinyl, propenyl, butadienyl, butenyl, pentenyl, pentadienyl, hexenyl, hexadienyl, heptenyl, octenyl, decenyl, undecenyl, dodecenyl, tetradecenyl, hexadecenyl or octadecenyl.

4. The film according to claim 3, wherein the acylamino is chosen from the group consisting of acryloylamino, methacrylamino, N-methacrylamino, N-ethylacrylamino, N-isopropyl acrylamino, N-tert-butyl acrylamino, N-hydroxymethylacrylamino, N-hydroxyethylacrylamino, N-(2-hydroxyl propyl) acrylamino, N,N'-methylene bisacrylamino, maleimido, oleoylamido, 9-hexadecanoenamino, N-(2-hydroxyl ethyl)-10-undecenamino, 9-tetradecenamino, 9-dodecaenamino, 9-decarbonamino, octenamino, heptanamino, hexenamino, pentenamino and butenamino.

5. The film according to claim 1, wherein the ethylene-α-olefin copolymer is a copolymer of ethylene and at least one α-olefin with a carbon number smaller than or equal to 10.

6. The film according to claim 5, wherein the α-olefin with the carbon number being smaller than or equal to 10 is chosen from the group consisting of propylene, 1-butene, 1-hexene, 1-pentene, 1-octylene or 4-methyl-1-pentene.

7. The film according to claim 5, wherein a density of the ethylene-α-olefin copolymer is 0.86-0.89 g/cm³, and a melt index of the ethylene-α-olefin copolymer is 1-40 g/10 min.

8. The film according to claim 7, wherein the density of the ethylene-α-olefin copolymer is 0.87-0.88 g/cm³, and a melt index of the ethylene-α-olefin copolymer is 3-30 g/10 min.

9. The film according to claim 1, wherein the film further comprising at least one ethylene-vinyl acetate copolymer layer, while the adjacent layers are different, and the ethylene-vinyl acetate copolymer layer is set on the modified polyolefin resin layer.

10. The film according to claim 9, wherein a thickness ratio of the adjacent modified polyolefin resin layer to the ethylene-vinyl acetate copolymer layer is 1:(1 to 3).

11. The film according to claim 10, wherein a raw material forming the modified polyolefin resin layer and the ethylene-vinyl acetate copolymer layer further comprises one or more of a crosslinking agent, an assistant crosslinking agent, an antioxidant, an ultraviolet light absorber, a light stabilizer, a tackifier, a corrosion inhibitor and a pigment.

12. An electronic device, comprising an encapsulated film, wherein the encapsulated film comprises the film according to claim 1.

13. The film according to claim 2, the film further comprising at least one ethylene-vinyl acetate copolymer layer, wherein the film is the ethylene-vinyl acetate copolymer layer while the adjacent layers are different, and the ethylene-vinyl acetate copolymer layer is set on the modified polyolefin resin layer.

14. The film according to claim 3, the film further comprising at least one ethylene-vinyl acetate copolymer layer, wherein the film is the ethylene-vinyl acetate copolymer layer while the adjacent layers are different, and the ethylene-vinyl acetate copolymer layer is set on the modified polyolefin resin layer.

15. The film according to claim 4, the film further comprising at least one ethylene-vinyl acetate copolymer layer, wherein the film is the ethylene-vinyl acetate copolymer layer while the adjacent layers are different, and the ethylene-vinyl acetate copolymer layer is set on the modified polyolefin resin layer.

16. The film according to claim 5, the film further comprising at least one ethylene-vinyl acetate copolymer layer, wherein the film is the ethylene-vinyl acetate copolymer layer while the adjacent layers are different, and the ethylene-vinyl acetate copolymer layer is set on the modified polyolefin resin layer.

17. The film according to claim 6, the film further comprising at least one ethylene-vinyl acetate copolymer layer, wherein the film is the ethylene-vinyl acetate copolymer layer while the adjacent layers are different, and the ethylene-vinyl acetate copolymer layer is set on the modified polyolefin resin layer.

18. The film according to claim 7, the film further comprising at least one ethylene-vinyl acetate copolymer layer, wherein the film is the ethylene-vinyl acetate copolymer layer while the adjacent layers are different, and the ethylene-vinyl acetate copolymer layer is set on the modified polyolefin resin layer.

19. The film according to claim 8, the film further comprising at least one ethylene-vinyl acetate copolymer layer, wherein the film is the ethylene-vinyl acetate copolymer layer while the adjacent layers are different, and the ethylene-vinyl acetate copolymer layer is set on the modified polyolefin resin layer.

* * * * *